US012156329B2

(12) United States Patent
Choi et al.

(10) Patent No.: US 12,156,329 B2
(45) Date of Patent: Nov. 26, 2024

(54) PRINTED CIRCUIT BOARD

(71) Applicant: SAMSUNG ELECTRO-MECHANICS CO., LTD., Suwon-si (KR)

(72) Inventors: Seong Ho Choi, Suwon-si (KR); Seong Il Jeon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 218 days.

(21) Appl. No.: 17/901,402

(22) Filed: Sep. 1, 2022

(65) Prior Publication Data

US 2023/0397330 A1 Dec. 7, 2023

(30) Foreign Application Priority Data

Jun. 7, 2022 (KR) .......................... 10-2022-0068861

(51) Int. Cl.
*H05K 1/11* (2006.01)
*H05K 1/02* (2006.01)

(52) U.S. Cl.
CPC .......... *H05K 1/0298* (2013.01); *H05K 1/115* (2013.01); *H05K 2201/0275* (2013.01); *H05K 2201/09554* (2013.01)

(58) Field of Classification Search
CPC ............................ H05K 1/0298; H05K 1/115
See application file for complete search history.

(56) References Cited

U.S. PATENT DOCUMENTS

| 2016/0021744 A1 | 1/2016 | Baek et al. |
| 2016/0234932 A1* | 8/2016 | Oshima ................ H05K 3/4682 |
| 2021/0282277 A1 | 9/2021 | Lin et al. |

FOREIGN PATENT DOCUMENTS

KR  10-2016-0010960 A   1/2016

* cited by examiner

*Primary Examiner* — Jeremy C Norris
(74) *Attorney, Agent, or Firm* — Morgan, Lewis & Bockius LLP

(57) ABSTRACT

A printed circuit board includes an insulating layer, and a first wiring layer at least partially embedded in one surface of the insulating layer, one surface of the first wiring layer being exposed from the one surface of the insulating layer. The insulating layer includes a first insulating layer covering at least a portion of a side surface of the first wiring layer, and a second insulating layer disposed on the first insulating layer and the first wiring layer, and the first and second insulating layers include different insulating materials.

20 Claims, 8 Drawing Sheets

PRINTED CIRCUIT BOARD

CROSS-REFERENCE TO RELATED APPLICATION(S)

This application claims benefit of priority to Korean Patent Application No. 10-2022-0068861 filed on Jun. 7, 2022 in the Korean Intellectual Property Office, the disclosure of which is incorporated herein by reference in its entirety.

TECHNICAL FIELD

The present disclosure relates to a printed circuit board.

BACKGROUND

In printed circuit boards having an Embedded Trace Substrate (ETS) structure using a thin material, for example, when using a material containing epoxy and glass, a lack of epoxy may occur on the upper part of the copper wiring due to physical collisions between an embedded copper wiring and a glass structure, and therefore, void defects may be caused after lamination.

SUMMARY

An aspect of the present disclosure is to provide a substrate having an ETS structure in which void defects may be prevented, even when a material having a relatively thin thickness, including glass, is used.

An aspect of the present disclosure is to perform a lamination process in which, after wiring is formed on a detachable core, a first insulating layer not containing a reinforcing material such as glass or the like is applied, and then, a thickness of the first insulating layer is relatively reduced by a thinning process, and thereafter, a second insulating layer of a relatively thickness containing a reinforcing material such as glass or the like is formed.

According to an aspect of the present disclosure, a printed circuit board includes an insulating layer; and a first wiring layer at least partially embedded in one surface of the insulating layer, one surface of the first wiring layer being exposed from the one surface of the insulating layer. The insulating layer includes a first insulating layer covering at least a portion of a side surface of the first wiring layer, and a second insulating layer disposed on the first insulating layer and the first wiring layer, and the first and second insulating layers include different insulating materials.

According to an aspect of the present disclosure, a printed circuit board includes a first insulating layer; a first wiring layer having a side surface partially covered by the first insulating layer and having one surface exposed from one surface of the first insulating layer; and a second insulating layer disposed on the other surface of the first insulating layer and the other surface of the first wiring layer, and covering another portion of the side surface of the first wiring layer. The other surface of the first wiring layer protrudes upwardly of the other surface of the first insulating layer.

According to an aspect of the present disclosure, a printed circuit board includes a first insulating layer; a second insulating layer disposed on one surface of the first insulating layer; a wiring layer embedded in the first insulating layer and the second insulating layer; and a via passing through the second insulating layer to be connected to the wiring layer and tapered in a direction away the wiring layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
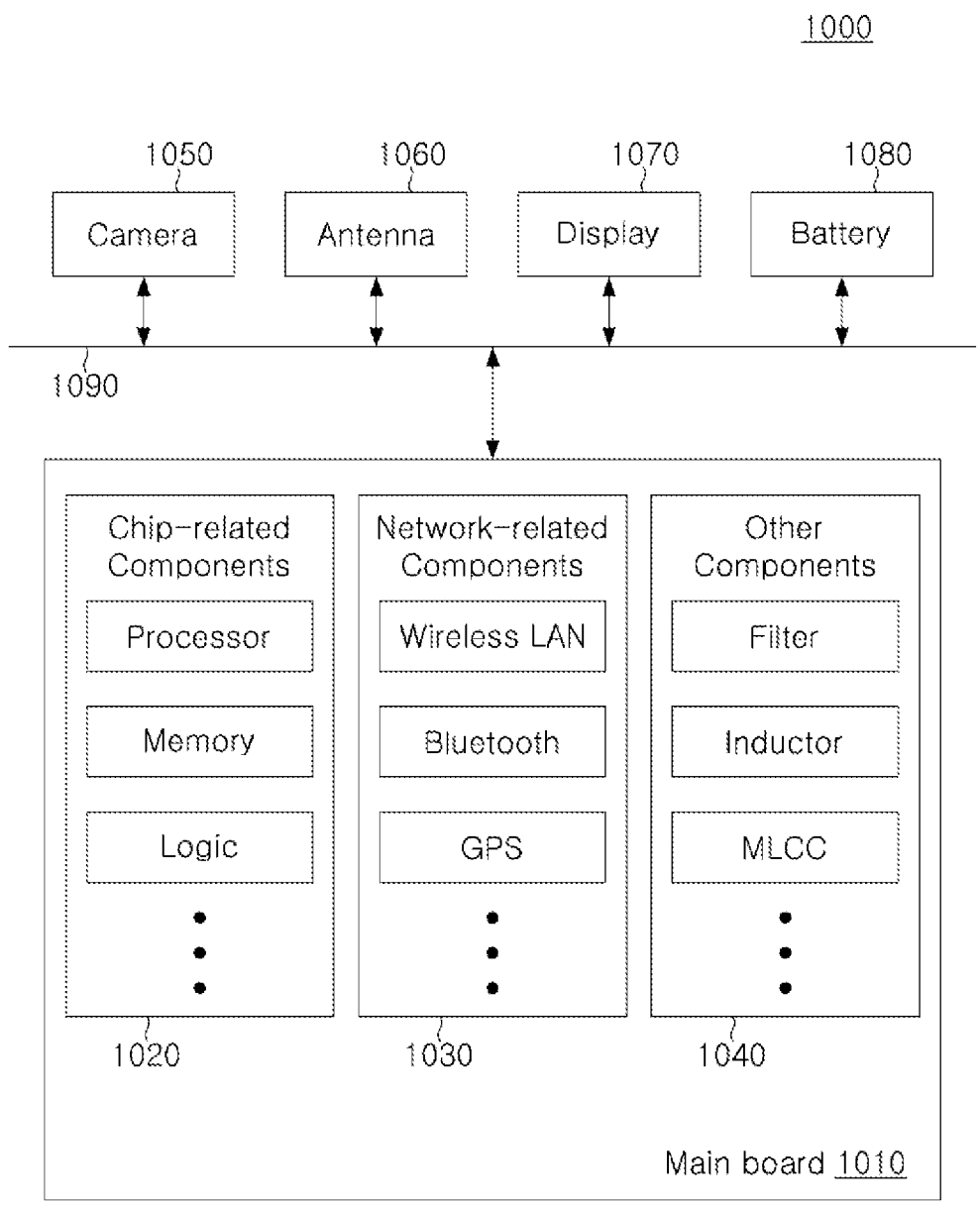
FIG. 1 is a block diagram schematically illustrating an example of an electronic device system.

Hereinafter, embodiments of the present disclosure will be described with reference to the accompanying drawings. The shapes and sizes of elements in the drawings may be exaggerated or reduced for clarity of description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related electronic components. In addition, the chip related components 1020 may be combined with each other. The chip-related component 1020 may be in the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+

(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components in the form of a chip component used for various other purposes, or the like. In addition, other components 1040 may be combined with each other, together with the chip related components 1020 or the network related components 1030 described above.

Depending on a type of the electronic device 1000, the electronic device 1000 may include other electronic components that may or may not be physically or electrically connected to the mainboard 1010. Examples of other electronic components include a camera module 1050, an antenna module 1060, a display device 1070, a battery 1080, and the like. However, other electronic components are not limited thereto, and may include, for example, an audio codec, a video codec, a power amplifier, a compass, an accelerometer, a gyroscope, a speaker, a mass storage unit (e.g., a hard disk drive), a compact disk (CD) drive, a digital versatile disk (DVD) drive, and the like. In addition thereto, these other components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
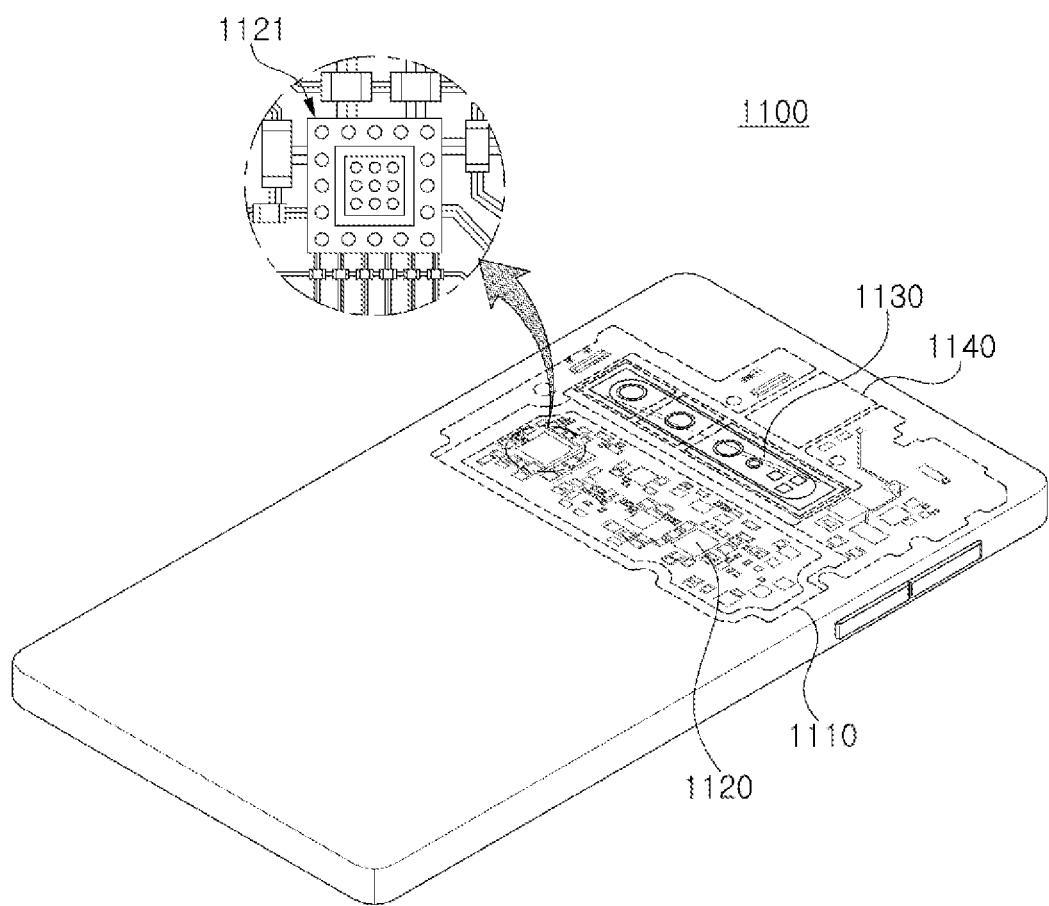
FIG. 2 is a perspective view schematically illustrating an example of an electronic device.

FIG. 2 is a schematic perspective view illustrating an example of an electronic device.

Referring to FIG. 2, the electronic device may be, for example, a smartphone 1100. A motherboard 1110 is accommodated inside the smartphone 1100, and various components 1120 are physically and/or electrically connected to the motherboard 1110. Also, other components that may or may not be physically and/or electrically connected to the motherboard 1110, such as a camera module 1130 and/or a speaker 1140, are accommodated in the smartphone 1100. A portion of the components 1120 may be the aforementioned chip-related component, for example, the component package 1121, but the present disclosure is not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. On the other hand, the electronic device is not necessarily limited to the smartphone 1100, and may also be other electronic devices as described above.

Printed Circuit Board

Figure 3:
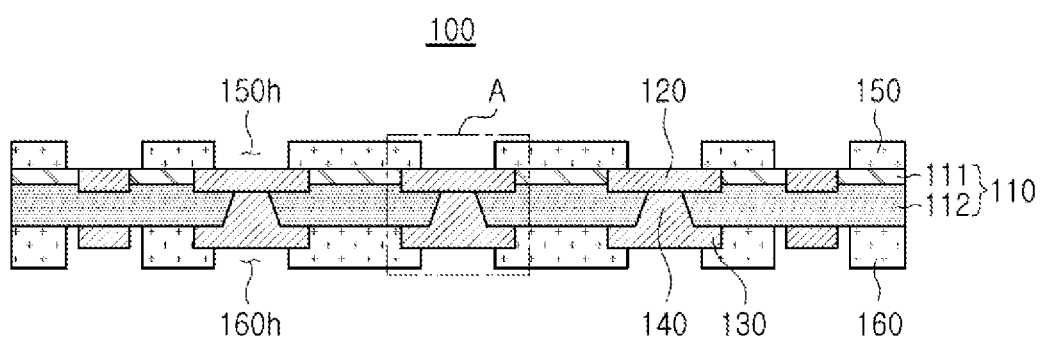
FIG. 3 is a cross-sectional view schematically illustrating an example of a printed circuit board.

FIG. 3 is a cross-sectional view schematically illustrating an example of a printed circuit board.

Figure 4:
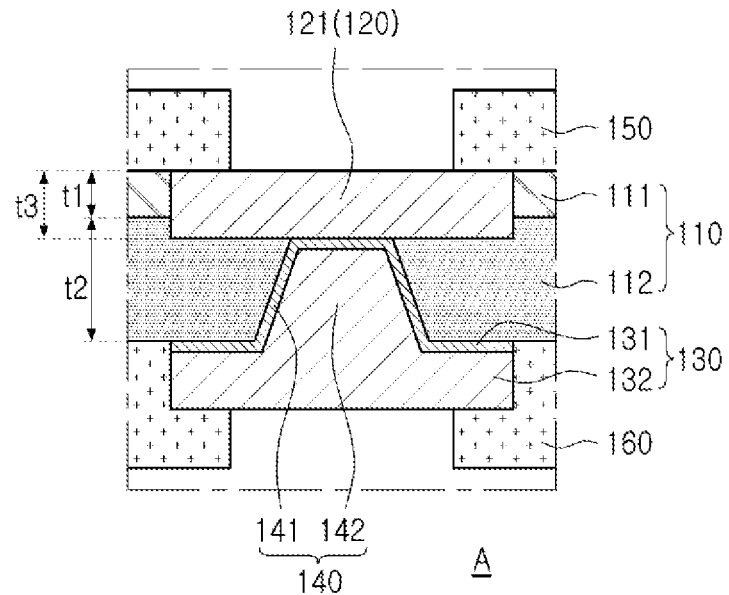
FIG. 4 is a schematic enlarged view according to an example of area A of FIG. 3.

FIG. 4 is a schematic enlarged view according to an example of area A of FIG. 3.

Figure 5:
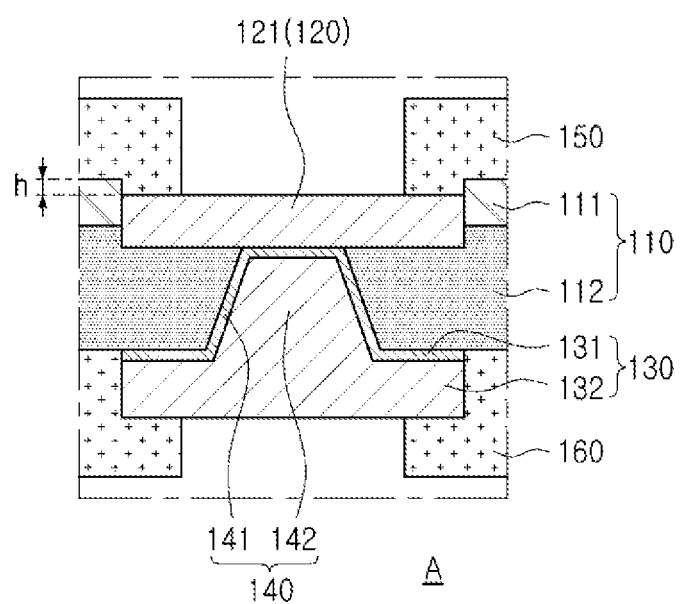
FIG. 5 is a schematic enlarged view according to another example of area A of FIG. 3.

FIG. 5 is a schematic enlarged view according to another example of area A of FIG. 3.

Referring to the drawings, a printed circuit board 100 according to an example includes an insulating layer 110, and a first wiring layer 120 of which at least a portion is embedded in one side of the insulating layer 110 and of which one surface is exposed from one surface of the insulating layer 110. The insulating layer 110 includes a first insulating layer 111 covering at least a portion of a side surface of the first wiring layer 120, and a second insulating layer 112 disposed on the first insulating layer 111 and the first wiring layer 120.

In addition, the printed circuit board 100 according to an example may further include a second wiring layer 130 disposed on the other surface of the insulating layer 110, a via layer 140 penetrating through the insulating layer 110 and electrically connecting the first and second wiring layers 120 and 130, a first resist layer 150 disposed on one surface of the insulating layer 110 and having a first opening 150*h* exposing at least a portion of the first wiring layer 120, and/or a second resist layer 160 disposed on the other surface of the insulating layer 110 and having a second opening 160*h* exposing at least a portion of the second wiring layer 130.

On the other hand, the first and second insulating layers 111 and 112 may include different insulating materials. For example, the first insulating layer 111 may include an insulating material not including a reinforcing material, and the second insulating layer 112 may include an insulating material including a reinforcing material. In this case, the reinforcing material is included to maintain rigidity, and may be, for example, a glass fiber (Glass Fiber, Glass Cloth, and/or Glass Fabric), but the present disclosure is not limited thereto. In detail, the first insulating layer 111 may include a solder resist, and the second insulating layer 112 may include a prepreg, but the present disclosure is not limited thereto. As such, when an insulating material that does not include a reinforcing material is used as the material of the first insulating layer 111 covering the upper portion of the first wiring layer 120, voids may be effectively prevented from occurring in the upper portion of the first wiring layer 120 due to a lack of a resin such as epoxy. In addition, when using an insulating material including a reinforcing material as the material of the second insulating layer 112, even with a relatively thin thickness, sufficient rigidity may be provided to the insulating layer 110, which may be advantageous for warpage control.

On the other hand, a thickness t1 of the first insulating layer 111 may be less than a thickness t2 of the second insulating layer 112. In more detail, the thickness t1 of the first insulating layer 111 may be thinner than a thickness t3 of the first wiring layer 120. Accordingly, the first insulating layer 111 may cover a portion of the side surface of the first wiring layer 120, and the second insulating layer 112 may cover another portion of the side surface of the first wiring layer 120. In this case, the thickness may indicate an average thickness. The thickness may be measured by capturing an image of a cut section of the printed circuit board 100 with a scanning electron microscope, and the average thickness may be an average value of thicknesses measured at five arbitrary points. In this manner, when the first insulating layer 111 is formed only sufficiently to prevent the occurrence of voids and the second insulating layer 112 is formed to a sufficient thickness, it may be more effective to simultaneously control void and warpage occurrence. In addition, since both the first insulating layer 111 and the second insulating layer 112 may be in contact with the side surface of the first wiring layer 120, reliability may be further improved.

On the other hand, the second wiring layer 130 may include a greater number of metal layers than the first wiring layer 120. For example, while the first wiring layer 120 may include only one metal layer 121 formed by electroplating, the second wiring layer 130 may include two or more metal layers 131 and 132, such as a metal layer 131 formed by electroless plating or with copper foil and a metal layer 132 formed by electrolytic plating. The via layer 140 formed together with the second wiring layer 130 may also include two or more metal layers 141 and 142, such as a metal layer 141 formed by electroless plating or copper foil and a metal layer 142 formed by electrolytic plating. The metal layers 131 and 132 of the second wiring layer 130 may be integrated with the metal layers 141 and 142 of the via layer 140, respectively. As such, the printed circuit board 100 according to an example may have an ETS structure, and thus the overall thickness of the substrate may be further reduced.

On the other hand, as illustrated in FIG. 4, one surface of the first wiring layer 120 may be substantially coplanar with one surface of the insulating layer 110, in detail, one surface of the first insulating layer 111. In this case, being substantially coplanar may indicate that one surfaces of both are located on substantially the same level within a process error range. In this manner, when forming the ETS structure and etching the seed layer provided from the copper foil of the detachable core or the like, by preventing the occurrence of recess depth, one surface of the first wiring layer 120 and one surface of the insulating layer 110 may be substantially coplanar.

On the other hand, as illustrated in FIG. 5, one surface of the first wiring layer 120 may have a step h with one surface of the insulating layer 110, in detail, one surface of the first insulating layer 111. In this case, having the step h may indicate that one surfaces of both the first wiring layer 120 and the insulating layer 110 are located on different levels outside the process error range. In this manner, when forming the ETS structure and etching the seed layer provided from the copper foil of the detachable core or the like, with the intention that a recess depth occurs, one surface of the first wiring layer 120 and one surface of the insulating layer 110 may have the step h.

Hereinafter, the components of the printed circuit board 100 according to an example will be described in more detail with reference to the drawings.

The first insulating layer 111 may include an insulating material. The insulating material may include a thermosetting resin such as an epoxy resin, or a material including an inorganic filler and/or an organic filler together with the resin. The insulating material may be a photosensitive material and/or a non-photosensitive material. For example, Solder Resist (SR) or the like may be used as the insulating material, but the present disclosure is not limited thereto. In addition, other polymer materials that may be applied to other thinning processes may be used.

The second insulating layer 112 may include an insulating material. The insulation material may include thermosetting resins such as epoxy resins, thermoplastic resins such as polyimides, or materials including inorganic fillers, organic fillers and/or glass fibers (Glass Fiber, Glass Cloth, and/or Glass Fabric) together with these resins. The insulating material may be a photosensitive material and/or a non-photosensitive material. For example, as the insulating material, Prepreg (PPG), Resin Coated Copper (RCC) insulating material, Copper Clad Laminate (CCL) insulating material, or the like may be used, and the present disclosure is not limited thereto, and other polymer materials having excellent rigidity may be used.

The first wiring layer 120 may include a metal material. The metal material may include copper (Cu), aluminum (Al), silver (Ag), tin (Sn), gold (Au), nickel (Ni), lead (Pb), titanium (Ti), and/or alloys thereof. The first wiring layer 120 may perform various functions according to a design, and for example, may include a ground pattern, a power pattern, a signal pattern, and the like. In this case, the signal pattern may include a pattern providing an electrical path for various signals other than ground and power, for example, a data signal. Each of these patterns may include a line pattern, a plane pattern, and/or a pad pattern. The first wiring layer 120 may be an electrolytic plating layer (or electrolytic copper).

The second wiring layer 130 may include a metal material. The metal material may include copper (Cu), aluminum (Al), silver (Ag), tin (Sn), gold (Au), nickel (Ni), lead (Pb), titanium (Ti), alloys thereof, and/or the like. The second wiring layer 130 may perform various functions according to a design, and for example, may include a ground pattern, a power pattern, a signal pattern, and the like. In this case, the signal pattern may include a pattern providing an electrical path for various signals other than ground and power, for example, a data signal. Each of these patterns may include a line pattern, a plane pattern, and/or a pad pattern. The second wiring layer 130 may include an electroless plating layer (or chemical copper) and an electrolytic plating layer (or electrolytic copper), or may include a metal foil (or copper foil) and an electrolytic plating layer (or electrolytic copper), or may include a metal foil (or copper foil), an electroless plating layer (or chemical copper), and an electrolytic plating layer (or electrolytic copper).

The via layer 140 may include a metal material. The metal material may include copper (Cu), aluminum (Al), silver (Ag), tin (Sn), gold (Au), nickel (Ni), lead (Pb), titanium (Ti), alloys thereof, and/or the like. The via layer 140 may perform various functions according to a design, and may include a ground via, a power via, a signal via, and the like. In this case, the signal via may include a via for electrical connection of various signals except for ground and power, for example, a data signal or the like. Each of the vias of the via layer 140 may have a tapered shape in which the width of one surface connected to the first wiring layer 120 is narrower than the width of the other surface connected to the second wiring layer 130 in cross-section. The via layer 140 may be formed together by the same plating process as a process of the second wiring layer 130, and thus may be integrated with the second wiring layer 130. The via layer 140 may include an electroless plating layer (or chemical copper) and an electrolytic plating layer (or electrolytic copper).

The first resist layer 150 may include an insulating material. The insulating material may include a thermosetting resin such as an epoxy resin, or a material including an inorganic filler and/or an organic filler together with the resin. The insulating material may be a photosensitive material and/or a non-photosensitive material. For example, Solder Resist (SR) may be used as the insulating material, but the present disclosure is not limited thereto. In addition, various polymer materials that may be used as the outermost layer material of the substrate may be used. The first resist layer 150 may have a plurality of openings 150h exposing at least a portion of the first wiring layer 120, respectively, and the opening 150h may expose at least a portion of the first wiring layer 120 in a solder mask defined (SMD) type or a non-solder mask defined (NSMD) type, respectively.

The second resist layer 160 may include an insulating material. The insulating material may include a thermosetting resin such as an epoxy resin, or a material including an inorganic filler and/or an organic filler together with the resin. The insulating material may be a photosensitive material and/or a non-photosensitive material. For example, Solder Resist (SR) or the like may be used as the insulating material, but the present disclosure is not limited thereto. In addition, various polymer materials that may be used as the outermost layer material of the substrate may be used. The second resist layer 160 may have a plurality of openings 160h respectively exposing at least a portion of the second wiring layer 130, and the opening 160h may expose at least a portion of the second wiring layer 130 in a solder mask defined (SMD) type or a non-solder mask defined (NSMD) type, respectively. On the other hand, when the buildup layer is further formed, the opening 160h may expose at least a portion of the buildup wiring layer.

FIGS. 6 to 14 are process diagrams schematically illustrating an example of manufacturing the printed circuit board of FIG. 3.

Figure 6:
FIGS. 6 to 14 are process diagrams schematically illustrating an example of manufacturing the printed circuit board of FIG. 3.

Referring to FIG. 6, a detachable core 200 in which a metal foil 220, for example, a copper foil is laminated on one surface or both surfaces of an insulating material 210 is prepared. For example, Copper Clad Laminate (CCL) may be used, but the present disclosure is not limited thereto, and in addition, various detachable cores used in the coreless process may be used.

Figure 7:
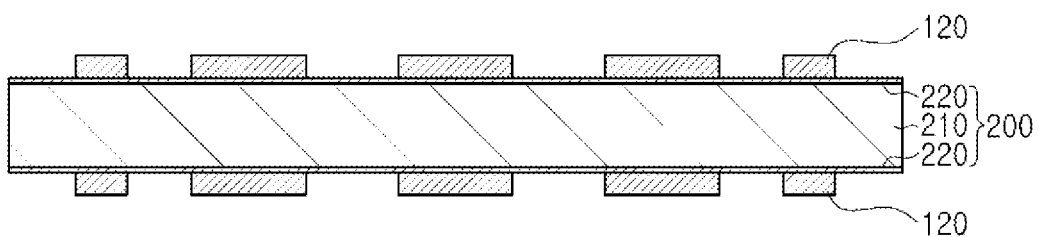

Referring to FIG. 7, the first wiring layer 120 is formed on the metal foil 220. The first wiring layer 120 may be formed by an electrolytic plating process using a photoresist. For example, the first wiring layer 120 may be formed by forming a photoresist on the metal foil 220 and patterning the same through exposure and development processes, and then filling the patterned area with electrolytic plating and peeling the photoresist.

Figure 8:
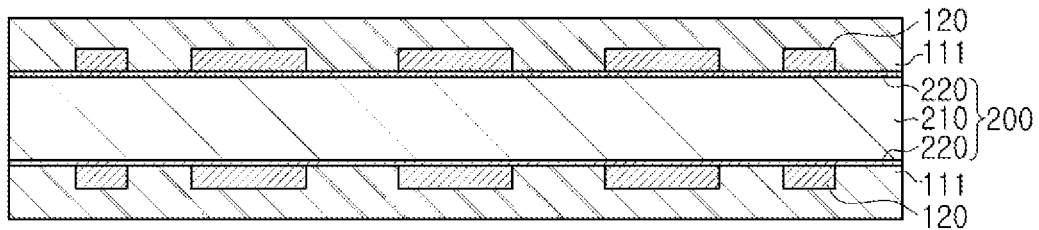

Referring to FIG. 8, a first insulating layer 111 filling the first wiring layer 120 is formed on the metal foil 220. The first insulating layer 111 may be formed by, for example, applying a solder resist.

Figure 9:
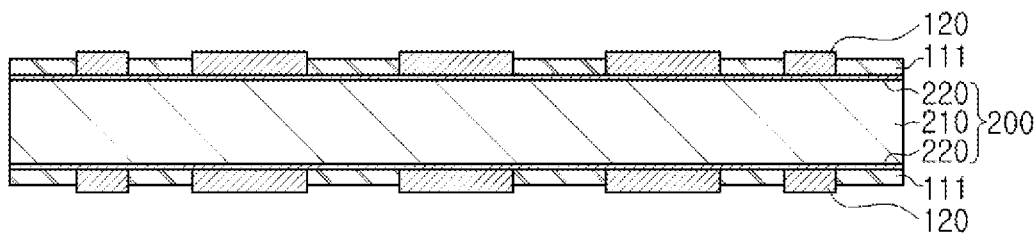

Referring to FIG. 9, the thickness of the first insulating layer 111 is formed thinner than the thickness of the first wiring layer 120. For example, a thinning process may be used. Therefore, the first insulating layer 111 may cover a portion of the side surface of the first wiring layer 120, and one surface of the first wiring layer 120 may protrude upwardly of one surface of the first insulating layer 111.

Figure 10:
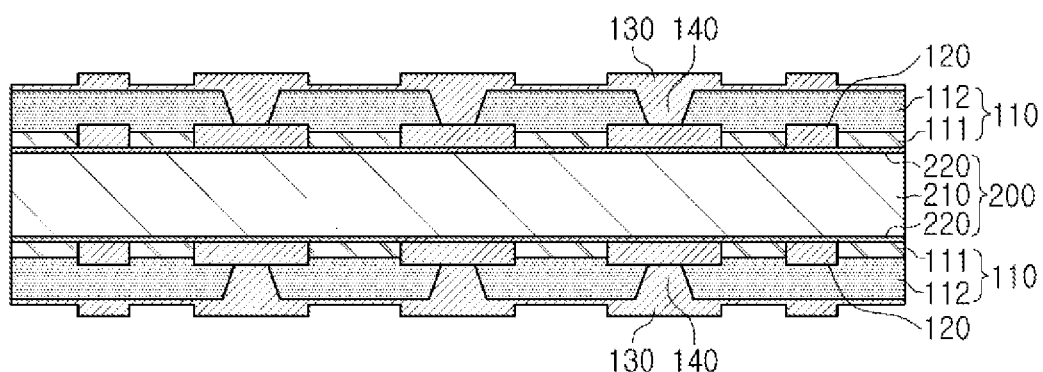

Referring to FIG. 10, a second insulating layer 112 is formed on the first insulating layer 111 and the first wiring layer 120. The second insulating layer 112 may be formed by laminating, for example, prepreg or resin coated copper (RCC). The second insulating layer 112 may cover respectively the other surfaces of the first insulating layer 111 and the first wiring layer 120, and may cover another part of the side surface of the first wiring layer 120. Thereafter, the second wiring layer 130 and the via layer 140 are formed on the second insulating layer 112. For example, in the second insulating layer 112, a via hole may be formed by laser processing or mechanical drilling, and after the seed layer is formed by electroless plating, the second wiring layer 130 and the via layer 140 may be formed by an electrolytic plating process using a photoresist.

Figure 11:
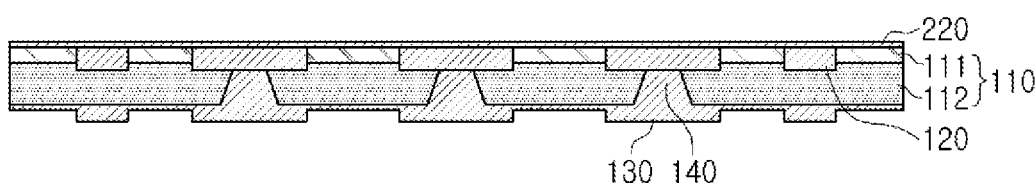

Referring to FIG. 11, the structure manufactured by the above-described process is separated from the insulating material 210.

Figure 12:
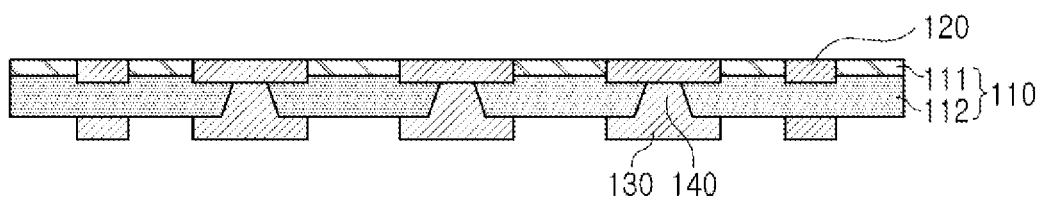

Referring to FIG. 12, a seed layer etching process is performed. The metal foil 220 may be removed by the seed layer etching process. Also, the seed layer and/or the copper foil formed on the second insulating layer 112 may be removed.

Figure 13:
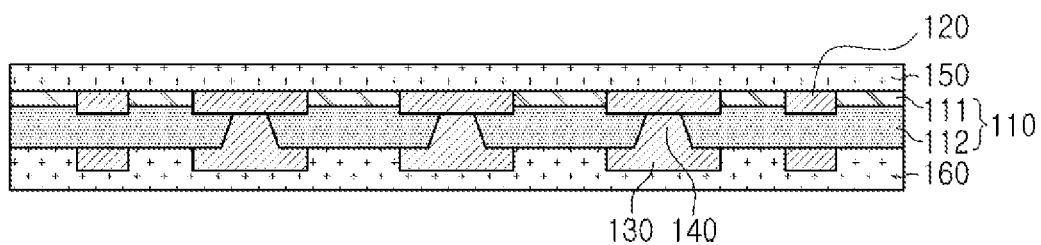

Referring to FIG. 13, first and second resist layers 150 and 160 are formed on both surfaces of the insulating layer 110. The first and second resist layers 150 and 160 may be respectively formed by applying solder resist, but the present disclosure is not limited thereto.

Figure 14:
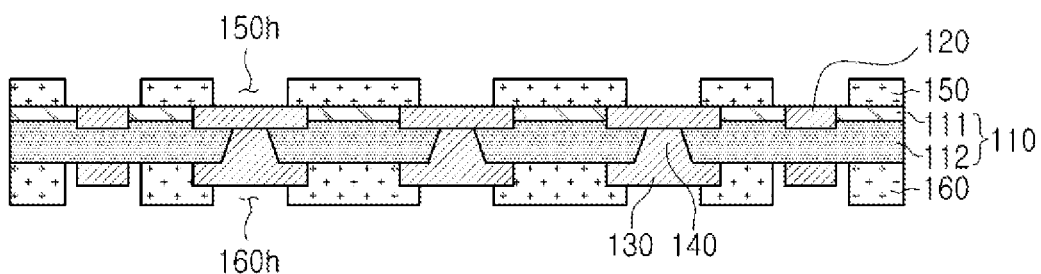

Referring to FIG. 14, first and second openings 150h and 160h are formed in the first and second resist layers 150 and 160 by a photolithography process or the like, respectively.

The printed circuit board 100 according to the above-described example may be formed through a series of processes. Other overlapping contents are omitted.

Figure 15:
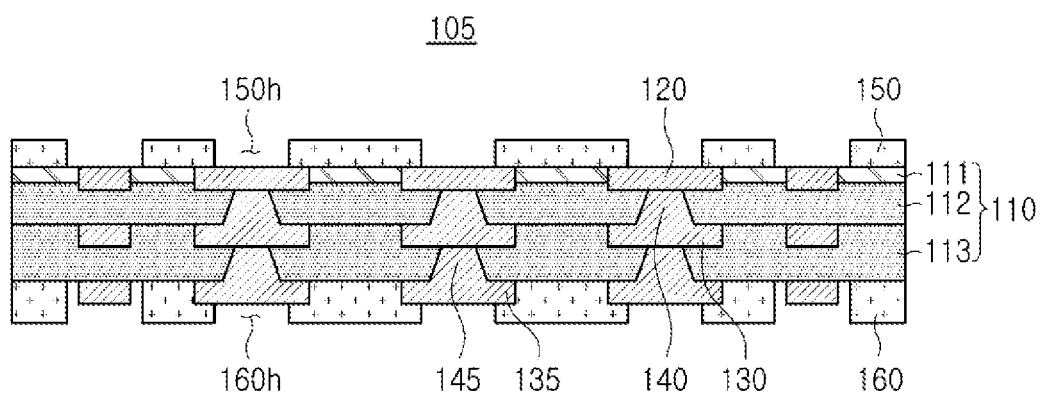
FIG. 15 is a cross-sectional view schematically illustrating another example of a printed circuit board.

FIG. 15 is a cross-sectional view schematically illustrating another example of a printed circuit board.

Referring to the drawings, in the printed circuit board 100 according to the above-described example, a printed circuit board 105 according to another example further includes a third insulating layer 113 disposed on the other surface of the second insulating layer 112 opposite to one surface thereof adjacent to the first insulating layer 111 and covering at least a portion of the second wiring layer 130, a third wiring layer 135 protruding from the other surface of the third insulating layer 113 that is opposite to one surface adjacent to the second insulating layer 112, and a second via layer 145 passing through the third insulating layer 113 and electrically connecting the second and third wiring layers 130 and 135.

The third insulating layer 113 may include an insulating material. The insulation material may include thermosetting resins such as epoxy resins, thermoplastic resins such as polyimides, or materials including inorganic fillers, organic fillers and/or glass fibers (Glass Fiber, Glass Cloth, and/or Glass Fabric) together with these resins. The insulating material may be a photosensitive material and/or a non-photosensitive material. For example, as the insulating material, Prepreg (PPG), Resin Coated Copper (RCC) insulating material, Copper Clad Laminate (CCL) insulating material, or the like may be used, but the present disclosure is not limited thereto, and other polymer materials having excellent other rigidity may also be used. The third insulating layer 113 may include substantially the same insulating material as the second insulating layer 112, and substantially the same insulating material may include the case being substantially identical as well as completely identical in composition, and for example, may be an insulating layer commercially available under the same brand name or the like.

The third wiring layer 135 may include a metal material. The metal material may include copper (Cu), aluminum (Al), silver (Ag), tin (Sn), gold (Au), nickel (Ni), lead (Pb), titanium (Ti), alloys thereof, and/or the like. The third wiring layer 135 may perform various functions according to a design, and for example, may include a ground pattern, a power pattern, a signal pattern, and the like. In this case, the signal pattern may include a pattern providing an electrical path for various signals other than ground and power, for example, a data signal and the like. Each of these patterns may include a line pattern, a plane pattern, and/or a pad pattern. The third wiring layer 135 may include an electroless plating layer (or chemical copper) and an electrolytic plating layer (or electrolytic copper), or may include a metal foil (or copper foil) and an electrolytic plating layer (or electrolytic copper), or may include a metal foil (or copper foil), an electroless plating layer (or chemical copper), and an electrolytic plating layer (or electrolytic copper).

The second via layer 145 may include a metal material. The metal material may include copper (Cu), aluminum (Al), silver (Ag), tin (Sn), gold (Au), nickel (Ni), lead (Pb), titanium (Ti), alloys thereof, and/or the like. The second via layer 145 may perform various functions according to a design, and for example, may include a ground via, a power via, a signal via, and the like. In this case, the signal via may include a via for electrical connection of various signals except for ground and power, for example, a data signal and the like. The via of the second via layer 145 may have a tapered shape in which the width of one surface connected to the second wiring layer 130 is narrower than the width of the other surface connected to the third wiring layer 135, on a cross-section. The second via layer 145 may be formed together by the same plating process as the third wiring layer 135, and thus may be integrated with the third wiring layer 135. The second via layer 145 may include an electroless plating layer (or chemical copper) and an electrolytic plating layer (or electrolytic copper).

On the other hand, if necessary, a fourth insulating layer may be further disposed between the second insulating layer 112 and the third insulating layer 113, and in this case, the second wiring layer 130 may be embedded in one surface of the fourth insulating layer in such a manner that one surface is exposed from the one surface of the fourth insulating layer. Also, the second via layer 145 may also pass through the fourth insulating layer. Also, the fourth insulating layer may be thinner than each of the second wiring layer 130 and the third insulating layer 113. Accordingly, the fourth insulating layer may cover a portion of the side surface of the second wiring layer 130, and the third insulating layer 113 may cover the remaining part of the side surface of the second wiring layer 130. On the other hand, the fourth insulating layer may include substantially the same insulating material as the first insulating layer 111. In addition, the characteristics described for the other first insulating layer 111 may also be applied to the fourth insulating layer.

On the other hand, if necessary, a build-up insulating layer, a build-up wiring layer, and a build-up via layer may be further formed on the other surface of the insulating layer 110, and the specific number of layers is not specifically limited. The build-up insulating layer may respectively include a plurality of insulating layers such as the first and second insulating layers 111 and 112, like the insulating layer 110, or only one insulating layer such as the second insulating layer 112. Each of the build-up wiring layers may include substantially the same structure and material as that of the second wiring layer 130. Each of the build-up via layers may include substantially the same structure and material as the via layer 140.

Other content is substantially the same as described in the printed circuit board 100 according to the above-described example, and unless contradictory, the contents described in the printed circuit board 100 according to the above-described example may also be applied to the printed circuit board 105 according to another example. Therefore, a detailed description of the overlapping content is omitted.

As set forth above, according to an embodiment, a substrate having an ETS structure capable of preventing void defects even when a relatively thin material including glass is used may be provided.

In the present disclosure, 'on the cross-section' may indicate a cross-sectional shape when the object is vertically cut, or a cross-sectional shape when the object is viewed from a side-view. In addition, the meaning on a plane may be a shape when the object is horizontally cut, or a flat shape when the object is viewed from a top-view or a bottom-view.

In the present disclosure, the lower side, the lower portion, the lower surface, and the like are used to refer to the direction toward the mounting surface of the semiconductor package including the organic interposer based on the cross section of the drawing for convenience, and the upper side, upper portion, upper surface and the like are used in the direction opposite thereto. However, this is to define the direction for convenience of explanation, and the scope of the claims is not limited by the description in this direction.

The meaning of being connected in the present disclosure is a concept including not only directly connected, but also indirectly connected through an adhesive layer or the like. In addition, the meaning of being electrically connected is a concept including both the case of being physically connected and the case of not being connected. In addition, expressions such as first, second, and the like are used to distinguish one component from another, and do not limit the order and/or importance of the corresponding components. In some cases, without departing from the scope of rights, the first component may be named as the second component, and similarly, the second component may be named as the first component.

The expression "an example" used in the present disclosure does not mean the same embodiment, and is provided to emphasize and explain different unique features. However, the examples presented above are not excluded from being implemented in combination with features of other examples. For example, even if a matter described in one specific example is not described in another example, it may be understood as a description related to another example unless a description contradicts the matter in another example.

The terminology used in the present disclosure is used to describe an example only, and is not intended to limit the present disclosure. In this case, the singular expression includes the plural expression unless the context clearly dictates otherwise.

While embodiments have been illustrated and described above, it will be apparent to those skilled in the art that modifications and variations could be made without departing from the scope of the present disclosure as defined by the appended claims.

What is claimed is:

1. A printed circuit board comprising:
an insulating layer;
a first wiring layer at least partially embedded in one surface of the insulating layer, one surface of the first wiring layer being exposed from the one surface of the insulating layer; and
a second wiring layer disposed on the other surface of the insulating layer,
wherein the insulating layer includes:
a first insulating layer covering at least a portion of a side surface of the first wiring layer; and
a second insulating layer disposed on the first insulating layer and the first wiring layer, the first and second insulating layers include different insulating materials, and the second wiring layer includes a greater number of metal layers than a number of the first wiring layer.

2. The printed circuit board of claim 1, wherein the second insulating layer comprises a reinforcing material, and the first insulating layer does not include the reinforcing material.

3. The printed circuit board of claim 2, wherein the reinforcing material comprises glass fibers.

4. The printed circuit board of claim 1, wherein the first insulating layer includes a solder resist, and the second insulating layer includes a prepreg.

5. The printed circuit board of claim 1, wherein the first insulating layer has a thickness less than a thickness of the first wiring layer.

6. The printed circuit board of claim 5, wherein the first insulating layer covers a portion of the side surface of the first wiring layer, and the second insulating layer covers the other portion of the side surface of the first wiring layer.

7. The printed circuit board of claim 1, wherein the one surface of the first wiring layer is substantially coplanar with the one surface of the insulating layer.

8. The printed circuit board of claim 1, wherein the one surface of the first wiring layer has a step difference from the one surface of the insulating layer.

9. The printed circuit board of claim 1, further comprising a via layer passing through the second insulating layer and connecting the first and second wiring layers.

10. The printed circuit board of claim 1, further comprising a first resist layer disposed on the one surface of the insulating layer and having a first opening exposing at least a portion of the first wiring layer.

11. The printed circuit board of claim 10, further comprising a second resist layer disposed on the other surface of the insulating layer and having a second opening exposing at least a portion of the second wiring layer.

12. A printed circuit board comprising:

a first insulating layer;

a first wiring layer having a side surface partially covered by the first insulating layer and having one surface exposed from one surface of the first insulating layer;

a second insulating layer disposed on the other surface of the first insulating layer and the other surface of the first wiring layer, and covering another portion of the side surface of the first wiring layer; and a second wiring layer protruding from the other surface of the second insulating layer, opposite to one surface of the second insulating layer adjacent to the first insulating layer, wherein the other surface of the first wiring layer protrudes upwardly of the other surface of the first insulating layer, and the second wiring layer includes a greater number of metal layers than a number of the first wiring layer.

13. The printed circuit board of claim 12, wherein the first insulating layer has a thickness less than a thickness of the second insulating layer.

14. The printed circuit board of claim 12, further comprising:

a first via layer passing through the second insulating layer and connecting the first and second wiring layers.

15. The printed circuit board of claim 14, further comprising:

a third insulating layer disposed on the other surface of the second insulating layer and covering at least a portion of the second wiring layer;

a third wiring layer protruding from the other surface of the third insulating layer, opposite to one surface of the third insulating layer adjacent to the second insulating layer; and a second via layer passing through the third insulating layer and connecting the second and third wiring layers.

16. A printed circuit board comprising:

a first insulating layer;

a second insulating layer disposed on one surface of the first insulating layer;

a first wiring layer embedded in the first insulating layer and the second insulating layer;

a second wiring layer disposed on the second insulating layer; and a via passing through the second insulating layer to connect to the first wiring layer and the second wiring layer to each other, the via tapered in a direction from the second wiring to the first wiring layer; and wherein the second wiring layer includes a greater number of metal layers than a number of the first wiring layer.

17. The printed circuit board of claim 16, wherein among the first insulating layer and the second insulating layer, a reinforcing material is included only in the second insulating layer.

18. The printed circuit board of claim 16, wherein the first insulating layer has a thickness less than a thickness of the second insulating layer.

19. The printed circuit board of claim 16, wherein a surface of the first wiring layer is substantially coplanar with a surface of the first insulating layer.

20. The printed circuit board of claim 16, further comprising a resist layer disposed on the first insulating layer and having an opening exposing at least a portion of the first wiring layer.

* * * * *